(12) United States Patent
Kim et al.

(10) Patent No.: US 8,853,088 B2
(45) Date of Patent: Oct. 7, 2014

(54) METHODS FOR FORMING GATES IN GATE-LAST PROCESSES AND GATE AREAS FORMED BY THE SAME

(75) Inventors: Jaeseok Kim, Seoul (KR); Ho Young Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 179 days.

(21) Appl. No.: 13/238,356

(22) Filed: Sep. 21, 2011

(65) Prior Publication Data

US 2012/0080755 A1 Apr. 5, 2012

(30) Foreign Application Priority Data

Oct. 5, 2010 (KR) ........................ 10-2010-0096742

(51) Int. Cl.
*H01L 21/311* (2006.01)
*H01L 21/8234* (2006.01)
*H01L 21/3205* (2006.01)

(52) U.S. Cl.
CPC .... *H01L 21/823456* (2013.01); *H01L 21/3205* (2013.01)
USPC ........... 438/699; 438/697; 438/698; 438/587; 438/763; 438/760; 257/E21.23

(58) Field of Classification Search
CPC ................................................ H01L 21/76837
USPC .................. 438/697, 698, 699, 587, 763, 759
See application file for complete search history.

(56) References Cited

U.S. PATENT DOCUMENTS

| 2009/0286384 A1* | 11/2009 | Wu et al. ........................ 438/584 |
| 2010/0065915 A1 | 3/2010 | Chuang |
| 2010/0087056 A1 | 4/2010 | Chung |
| 2010/0148261 A1* | 6/2010 | Fukushima et al. .......... 257/349 |
| 2012/0032238 A1* | 2/2012 | Teo et al. ...................... 257/288 |
| 2012/0248509 A1* | 10/2012 | Guo et al. ..................... 257/288 |

FOREIGN PATENT DOCUMENTS

JP 04-123439 4/1992

OTHER PUBLICATIONS

Williams et al., "Etch Rates for Micromachining Processing," J. Microelectromech Systems, vol. 5, No. 4 (Dec. 1996).*

* cited by examiner

*Primary Examiner* — Eva Y Montalvo
*Assistant Examiner* — Christopher Johnson
(74) *Attorney, Agent, or Firm* — Myers Bigel Sibley & Sajovec, PA (57) ABSTRACT

Methods are provided for forming gates in gate-last processes. The methods may include performing chemical mechanical polishing (CMP) on an interlayer dielectric (ILD) that is on a plurality of dummy gates, each of the plurality of dummy gates including a gate mask in an upper portion thereof, and the CMP exposing the gate mask. The methods may also include removing the gate mask by etching the gate mask. The methods may further include performing CMP on the ILD.

18 Claims, 10 Drawing Sheets

METHODS FOR FORMING GATES IN GATE-LAST PROCESSES AND GATE AREAS FORMED BY THE SAME

CROSS-REFERENCE TO RELATED APPLICATION

This U.S. non-provisional patent application claims priority under 35 U.S.C. §119 to Korean Patent Application No. 10-2010-0096742, filed on Oct. 5, 2010, the disclosure of which is hereby incorporated by reference in its entirety.

BACKGROUND

The present disclosure relates to methods for fabricating semiconductor devices, and, more particularly, to methods for forming gates in gate-last processes, and to gate areas formed by the methods.

As integrated circuit (IC) size decreases, control of the distribution in the height of a gate also may decrease. In particular, as embedded source/drain technologies and elevated source/drain technologies are introduced to form a source/drain of a gate-last process, control of a gate height may be difficult.

A gate-last process is a process in which a gate is formed last. The gate-last process may include chemical mechanical polishing (CMP) of an interlayer dielectric (ILD), etching or CMP of a gate mask, removal of a dummy gate, and an aluminum Damascene process.

However, a reduction in the height of a gate may result from the gate-last process. For example, as a result of decreased IC design size, a gate height may be relatively low. On the other hand, the height of a gate may be designed to exceed the height of an elevated source/drain. Accordingly, the gate may have a height that is designed to be in a relatively narrow range.

Figure 1:
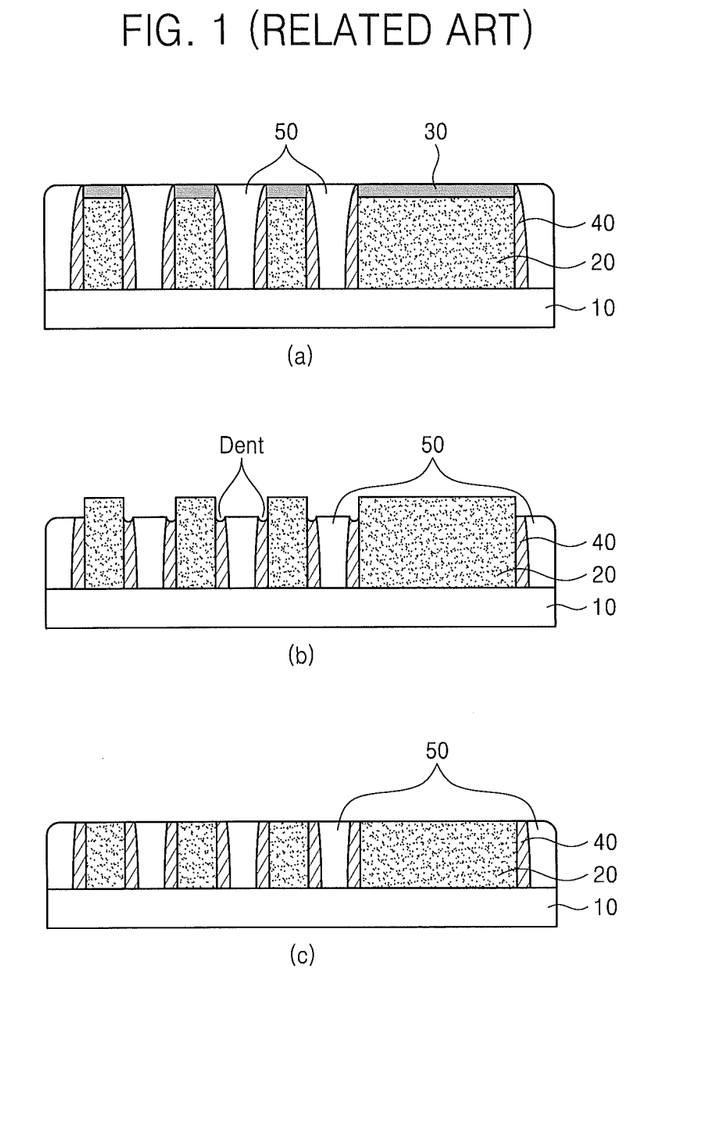
Figure 2:
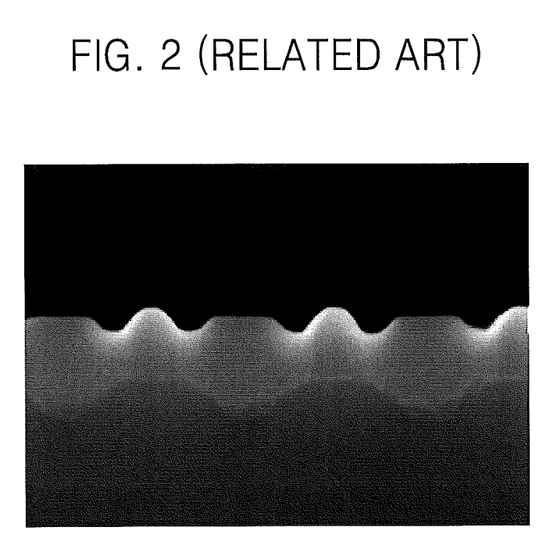
FIG. 2 is a scanning electron microscope (SEM) image showing a side of a gate area after etching in a method of forming a gate according to a related art.

FIGS. 1(a), 1(b), and 1(c) are side views of a cross-section of a gate area formed in a gate-last process. FIG. 1(a) illustrates a gate area that is planarized by CMP of an ILD. FIG. 1(b) illustrates a gate area in which a gate mask is etched. FIG. 1(c) illustrates a gate area in which a gate mask is CMP-ed. FIG. 2 is a scanning electron microscope (SEM) image showing a side view of a gate area formed by over-etching in a gate-last process.

Referring to FIGS. 1(a), 1(b), 1(c), and 2, a gate area in a gate-last process may include a semiconductor substrate 10, a dummy gate 20, a gate mask 30, a spacer 40, and an interlayer dielectric (ILD) 50. As illustrated in FIG. 1(a), an ILD 50 CMP process may be performed until the gate mask 30 is exposed. In doing so, the amount of the gate mask 30 that remains after the ILD 50 CMP process may vary according to the density of a pattern of the dummy gate 20. For example, more of the gate mask 30 may remain at a portion where the density of the pattern of the dummy gate 20 is high. As a result, the gate height may have a wide distribution.

Also, the gate mask 30 removal process (removal by etching) of FIG. 1(b) may be burdensome to subsequent processes because a local dent may be generated in an upper portion of the spacer 40 as a result of over-etching. Referring to FIG. 1(c)'s gate mask 30 removal process (removal by CMP), if the polishing continues into the dummy gate 20, then the reduction in the gate height may be significant.

If the distribution in the height of a gate is too wide, then the resulting problems may include a resistance defect, source/drain exposure after dummy gate 20 exposure, contamination due to electrode material exposure, or a dummy gate 20 removal defect.

SUMMARY

According to some embodiments, methods of forming gates in gate-last processes may be provided. The methods may include performing a first chemical mechanical polishing (CMP) on a first interlayer dielectric (ILD) that is on a plurality of dummy gates. Each of the plurality of dummy gates may include a gate mask in an upper portion thereof. Also, the first CMP may expose a surface of the gate mask. The methods may also include removing the gate mask by etching the gate mask. The methods may further include depositing a second ILD on the plurality of dummy gates after removing the gate mask. The methods may additionally include performing a second CMP on the second ILD.

In some embodiments, etching the gate mask may include etching by dry etching or wet etching.

In some embodiments, in removing the gate mask by etching the gate mask, an etching rate selectivity between the gate mask and the first ILD may range from about 1:1.5 to about 1:0.5.

In some embodiments, in removing the gate mask by etching the gate mask, an etching rate selectivity between the gate mask and each of the of plurality of dummy gates may range from about 2:1 to about 1000:1.

In some embodiments, the first ILD may include oxide.

In some embodiments, the gate mask may include silicon nitride ($Si_3N_4$).

In some embodiments, each of the plurality of dummy gates may include polysilicon (Poly-Si).

In some embodiments, the second ILD may be deposited by any one of tetra ethyl ortho silicate (TEOS), high density plasma (HDP), spin-on-glass (SOG), high aspect ratio process (HARP), and flowable chemical vapor deposition (FCVD).

In some embodiments, the second ILD may deposited to a thickness ranging from about 150 Å to about 1000 Å.

In some embodiments, the second CMP on the second ILD may be performed at a selectivity of polishing speed between the second ILD and each of the plurality of dummy gates that ranges from about 10:1 to about 200:1. Also, the second CMP may provide a polish stop on an upper surface of each of the plurality of dummy gates.

In some embodiments, each of the plurality of dummy gates may have spacers on opposing sidewalls thereof.

In some embodiments, the second CMP may be performed on portions of the first ILD.

In some embodiments, the first ILD may be between the spacers. Additionally, the second ILD may include a capping ILD. Also, depositing the second ILD may include covering top surfaces of the spacers and a top surface of the first ILD.

In some embodiments, a top surface of the second ILD may be substantially coplanar with top surfaces of the plurality of dummy gates after performing the second CMP.

According to some embodiments, gate areas in gate-last processes may be provided. The gate areas may include a plurality of dummy gates arranged on a semiconductor substrate. The gate areas may also include spacers on opposing sidewalls of each of the plurality of dummy gates. The gate areas may further include a first interlayer dielectric (ILD) between the spacers. The gate areas may additionally include a second ILD on the first ILD.

In some embodiments, the second ILD may include a capping ILD that covers top surfaces of the spacers and a top surface of the first ILD.

In some embodiments, a top surface of the second ILD may be substantially coplanar with top surfaces of the plurality of dummy gates.

In some embodiments, the first ILD may include oxide, the gate mask may include silicon nitride ($Si_3N_4$), and each of the plurality of dummy gates may include polysilicon (Poly-Si).

In some embodiments, the second ILD may include oxide.

According to some embodiments, methods of forming gates in gate-last processes may be provided. The methods may include performing a first chemical mechanical polishing (CMP) on an interlayer dielectric (ILD) that is on a plurality of dummy gates. Also, each of the plurality of dummy gates may include a gate mask in an upper portion thereof. Moreover, the first CMP may expose a surface of the gate mask. The methods may also include removing the gate mask by etching the gate mask. Furthermore, an etching rate of a silicon nitride material may be greater than an etching rate of the ILD. The methods may further include performing a second CMP on the ILD such that a top surface of the ILD may be substantially coplanar with top surfaces of the plurality of dummy gates.

In some embodiments, the plurality of dummy gates may have spacers on opposing sidewalls thereof. Also, at least one of the plurality of dummy gates and the spacers may include the silicon nitride material. Moreover, the ILD may include oxide.

BRIEF DESCRIPTION OF THE DRAWINGS

The above and other features and advantages of the disclosure will become more apparent by describing in detail example embodiments thereof with reference to the attached drawings in which:

FIGS. 1(*a*), 1(*b*) and 1(*c*) are side views of a cross-section of a gate area formed in a method according to a related art;

FIGS. 7(*a*), 7(*b*), and 7(*c*) are SEM images illustrating a side view of a gate area, according to some embodiments;

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments of manufacturing a semiconductor device, a gate-last process may include removing an oxide film from a dummy gate to form a gate electrode (e.g., by a Damascene process).

Figure 3:
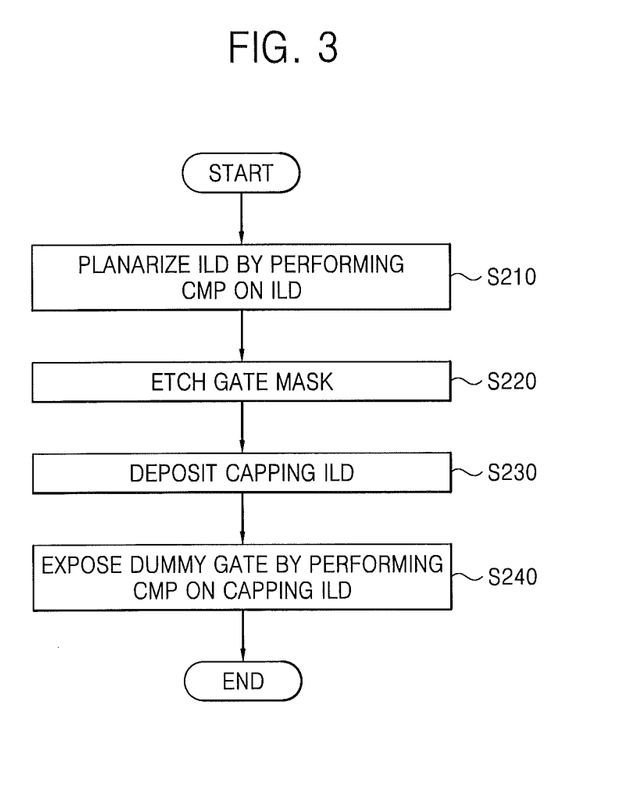
FIG. 3 is a flowchart illustrating a method of forming a gate, according to some embodiments.
Figure 4:
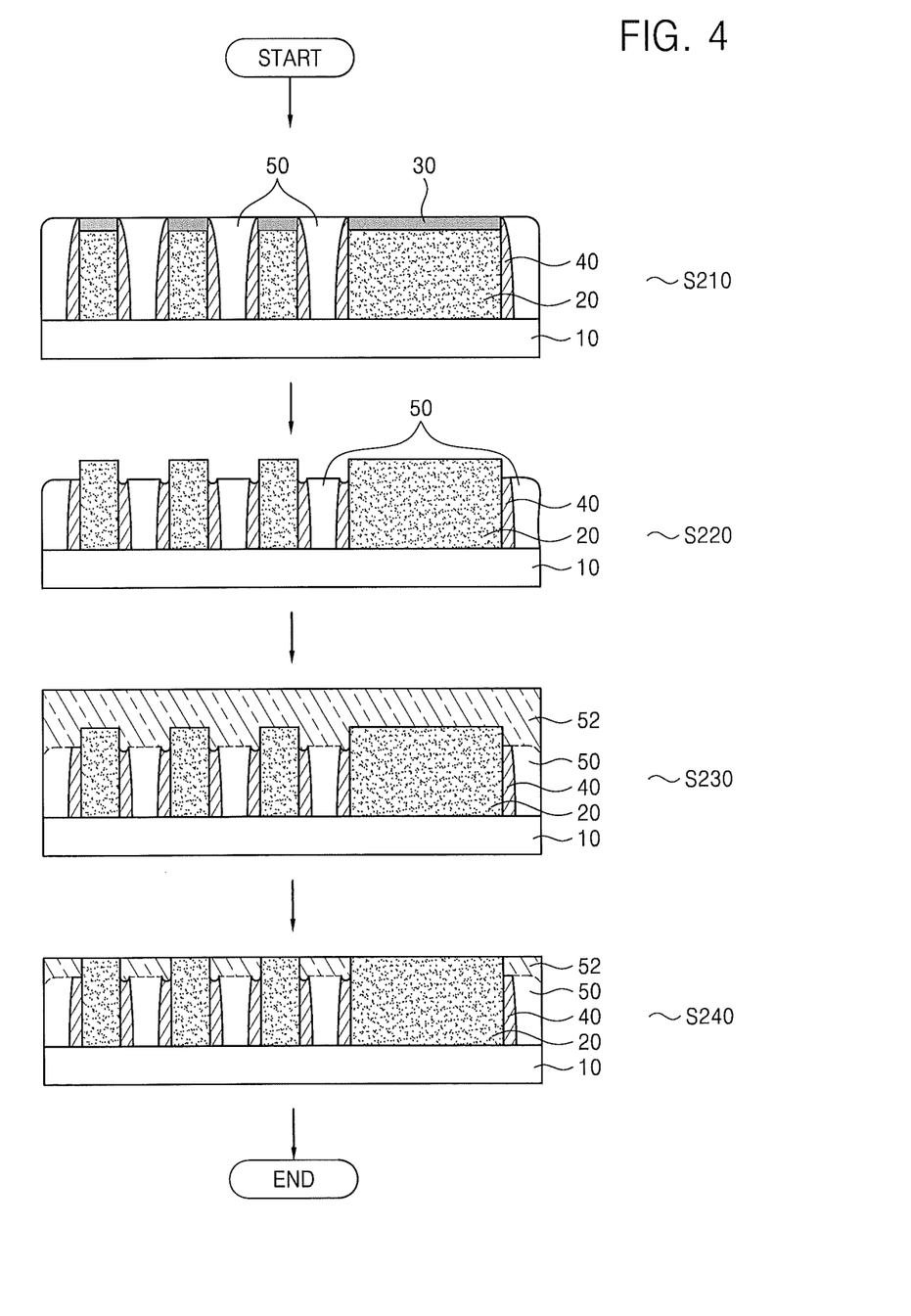
FIG. 4 is a side view of a gate area formed by the process of FIG. 3, according to some embodiments.

FIG. 3 is a flowchart illustrating a method of forming a gate in a gate-last process, according to some embodiments. FIG. 4 is a side view of a gate area on which the method of FIG. 3 is used, according to some embodiments.

Referring to operation S210 of FIGS. 3 and 4, the interlayer dielectric layer (ILD) 50 is planarized by chemical mechanical polishing (CMP). The ILD 50 may be between an upper portion of a gate area and a dummy gate 20. Also, the ILD 50 may include an oxide film. The CMP of the ILD 50 may be performed until the gate mask 30 (e.g., a top surface of the gate mask 30) is exposed.

In a further operation (S220 of FIGS. 3 and 4), the gate mask 30 is etched and may be substantially or completely removed. At least one of dry etching and wet etching may be used to etch the gate mask 30. To improve process efficiency, the gate mask 30 etching process may be performed using over-etching. For example, an upper portion of the spacer 40 (or a stopper) disposed along a side surface of the dummy gate 20 may be over-etched so that a local dent may be generated in the spacer 40 (or the stopper). The spacer 40 may include silicon nitride. Also, under some circumstances, dishing may occur in a portion of the ILD 50 that fills a gap between the neighboring dummy gates 20.

In other words, the shape of the local dent generated in the spacer 40, as well as the shape of the dishing generated in the ILD 50, may vary according to a selectivity of the etching rate between films. The selectivity of the etching rate may be determined with respect to different materials (e.g., silicon nitride vs. oxide, and silicon nitride vs. polysilicon) of the gate structure.

The selectivity of the etching rate between silicon nitride and polysilicon may range from about 2:1 to about 1000:1.

Also, the selectivity of the etching rate between silicon nitride and oxide may vary in consideration of process efficiency, and the selectivity may range from about 1:1.5 to about 1:0.5. If the selectivity of the etching rate between silicon nitride and oxide is smaller than about 1:1.5, then an etching rate of the oxide of the ILD 50 may be too high, and dishing of the oxide may be generated relatively deeply in the ILD 50 between neighboring dummy gates 20. The dishing of the oxide of the ILD 50 may burden subsequent processes.

On the other hand, when the selectivity of the etching rate between silicon nitride and oxide is greater than 1:0.5 (e.g., an etching rate of silicon nitride is relatively high), a significant dent may be generated in the spacer 40 along a sidewall of the dummy gate 20, which may also burden subsequent processes. In particular, when the etching rate of silicon nitride is greater than that of oxide, the ILD 50 may bulge between neighboring dummy gates 20. For example, a top surface of the ILD 50 may protrude beyond the dented surfaces of the spacers 40 in a direction away from the semiconductor substrate 10. Alternatively, if the etching rate of silicon nitride is less than that of oxide, then the ILD 50 may appear to be concave between neighboring dummy gates 20. Additionally, if the etching rates of the silicon nitride and the oxide are substantially the same, then the a top surface of the ILD 50 may appear to be substantially flat and substantially coplanar with a top surface of the spacers 40.

Although FIG. 4 illustrates a case in which the oxide of the ILD 50 results in dishing only in portions of the ILD 50 between neighboring dummy gates 20, the selectivity of the etching rate may be changed according to process conditions. Thus, during etching of the gate mask 30, the shape of a surface after etching may vary according to the selectivity of the etching rate between silicon nitride and oxide. Also, depending on gate characteristics, a process of depositing a capping ILD (e.g., the capping ILD 52 illustrated in operation 5230) may be omitted in some embodiments.

In a further operation (S230 in FIGS. 3 and 4), a capping ILD 52 is provided. In some embodiments, the capping ILD 52 may be formed of the same oxide as that of the ILD 50. The capping ILD 52 may be provided to recover a surface where the gate mask 30 has been removed by the etching in the operation 5220. Accordingly, portions of the gate structure in which a dent and/or dishing occur may be covered because the capping ILD 52 is deposited on exposed portions (e.g., a top surface and/or upper side surfaces) of the dummy gate 20, on the spacer 40 along a sidewall of the dummy gate 20, and on the ILD 50 between neighboring dummy gates 20.

Deposition of the capping ILD 52 may be performed using various methods, such as tetra ethyl ortho silicate (TEOS), high density plasma (HDP), spin-on-glass (SOG), high aspect ratio process (HARP), flowable chemical vapor deposition (FCVD), etc.

During the gate mask 30 etching (operation S220), a dent may be generated at a depth/level of 150 Å under the process condition. Accordingly, the capping ILD 52 may be deposited to a thickness ranging from about 150 Å to about 1000 Å to cover the dent and to simultaneously reduce an amount of polishing in a subsequent CMP process.

Accordingly, as a dent formed in the spacer 40 along a sidewall of the dummy gate 20 is compensated/covered/reinforced using the capping ILD 52 (e.g., oxide), generation of a dent in a subsequent process (e.g., a subsequent dummy gate stripe process) may be reduced/prevented. Additionally, a material that is dished by the gate mask 30 etching (e.g., an oxide of the ILD 50 that is dished by the gate mask 30 etching) may be covered by the capping ILD 52.

In a further operation (S240 in FIGS. 3 and 4), the dummy gate 20 is exposed by performing CMP on the capping ILD 52 deposited in the operation 5230. In doing so, the CMP may be performed not only on the capping ILD 52 that is newly deposited in the operation S230 but also on remaining portions of the ILD 50 (e.g., portions of the ILD 50 that are not removed by the etching in the operation S220). Portions of the ILD 50 may remain because etching may be completed at a level higher (e.g., farther from the semiconductor substrate 10) than the dummy gate 20. For example, this may occur when the selectivity of silicon nitride in the etching of operation S220 is greater than that of oxide.

The CMP applied in operation S240 may be directed toward a combined/single ILD. In other words, the combined/single film to be polished is an oxide film, as opposed to a CMP for exposing the dummy gate. Thus, a polishing stop efficiency in polysilicon may be increased/maximized by increasing a selectivity of the polishing rate between oxide and polysilicon.

Through the above-described operations, loss in the height of the dummy gate 20 (e.g., a polysilicon dummy gate 20) may be reduced/minimized in gate formation such that distribution in the height of a gate may be reduced/minimized. As such, the capping ILD 52 (e.g., oxide) may be formed on an upper surface of the spacer 40 as a protection film of the dummy gate 20.

Figure 5:
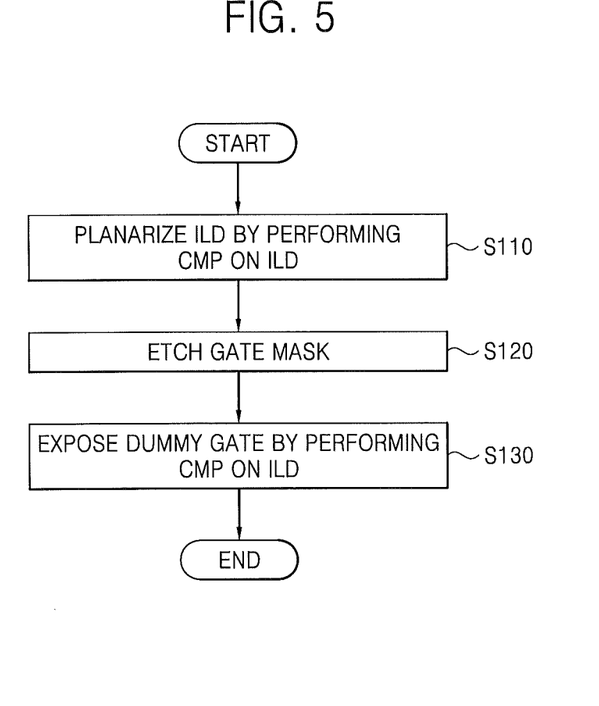
FIG. 5 is a flowchart illustrating a method of forming a gate, according to some embodiments.
Figure 6:
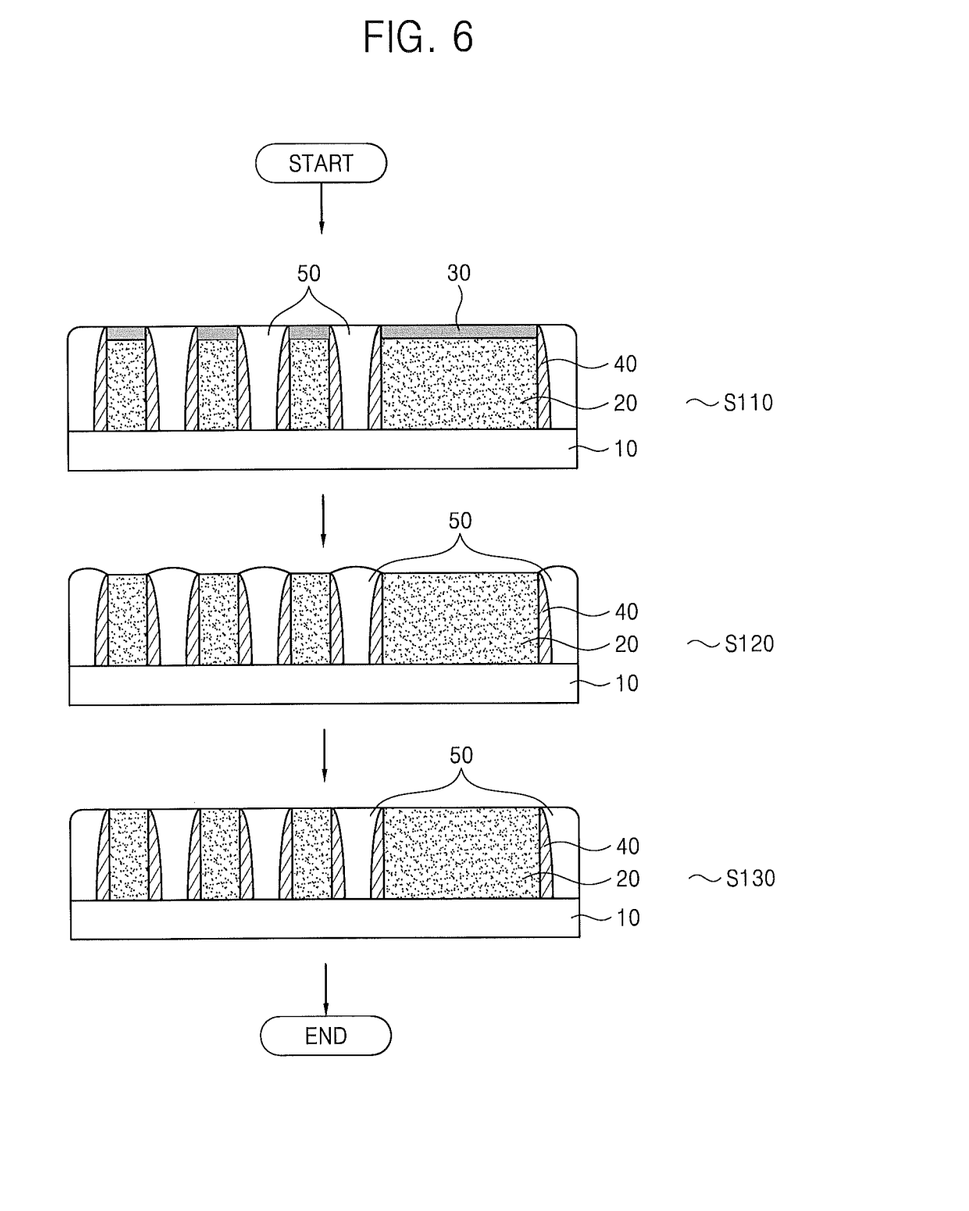
FIG. 6 is a side view of a gate area formed by the process of FIG. 5, according to some embodiments.

FIG. 5 is a flowchart illustrating a method of forming a gate according to some embodiments. FIG. 6 is a side view of a gate area according to the process of FIG. 5.

Referring to FIGS. 5 and 6, a method of forming a gate according to some embodiments includes an operation of planarizing the ILD 50 by performing CMP thereon (S110), an operation of etching the gate mask 30 (S120), and an operation of exposing the dummy gate 30 by performing CMP on the ILD 50 (S130).

A capping ILD 52 deposition process may be omitted from the method of FIG. 5, according to some embodiments.

In the gate mask 20 etching process (operation S120), an etching rate of silicon nitride may be greater than that of oxide. As a result, the height of the ILD 50 (e.g., oxide) between neighboring dummy gates 20 may be higher (e.g., farther from the semiconductor substrate 10) than that of the exposed dummy gate 20. Accordingly, compensation/reinforcement by depositing the capping ILD 52 on the exposed dummy gate 20 may be omitted. Therefore, in some embodiments, the method may be completed by the ILD CMP process (operation S130) after the gate mask 30 etching process (operation S120), without depositing the capping ILD 52.

Figure 7:
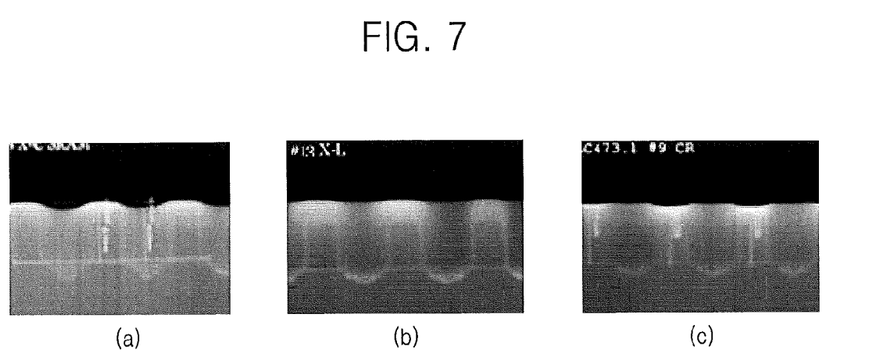

FIGS. 7(a), 7(b), and 7(c) are SEM images illustrating a side of a gate area after etching according to the selectivity of etching rate between nitride and oxide in a gate mask etching process, according to some embodiments of FIGS. 3-6.

FIG. 7(a) illustrates a case in which the etching rate of oxide is greater than that of silicon nitride ($Si_3N_4$). For example, the selectivity of the etching rate may be about $Si_3N_4$:Oxide=1:1.3. FIG. 7(b) illustrates a case in which the etching rate of oxide is about the same as that of silicon nitride (e.g., $Si_3N_4$:Oxide=1:1). FIG. 7(c) illustrates a case in which the etching rate of silicon nitride is greater than that of oxide (e.g., $Si_3N_4$:Oxide=1:0.8).

As shown in FIG. 7(a), an oxide filling a gap between the dummy gates 20 may be etched/cut away deeper/more (e.g., closer to the semiconductor substrate 10) than the dummy gate 20 (e.g., silicon nitride) if the etching rate of oxide is greater than that of silicon nitride. On the other hand, FIG. 7(b) shows that a degree of etching between silicon nitride and oxide is substantially similar, forming a relatively even surface (e.g., a substantially coplanar surface for the oxide and the silicon nitride). In contrast, FIG. 7(c) shows that the etching rate of oxide is less than that of silicon nitride such that an oxide portion protrudes higher than the dummy gate 20. Thus, if the etching rate of silicon nitride is greater than that of oxide, as shown in FIG. 7(c), and if the process of depositing the capping ILD 52 is omitted after etching, then the dummy gate 20 may be exposed by performing an ILD CMP process (e.g., as in operation S130 of FIGS. 5 and 6).

Figure 8:
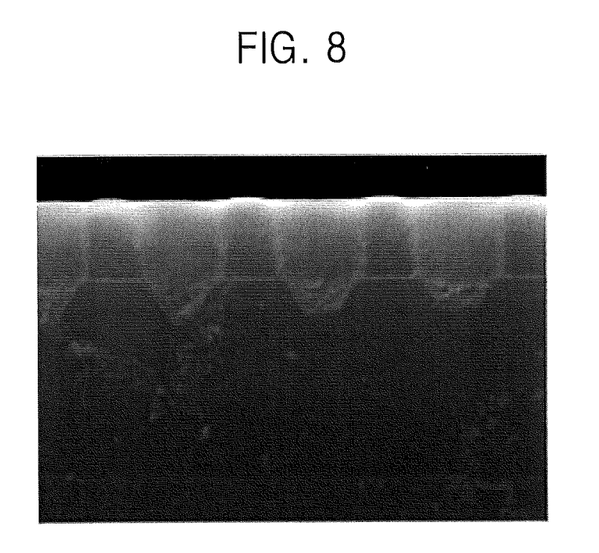
FIG. 8 is a SEM image illustrating a side view of a gate area, according to some embodiments.
Figure 9:
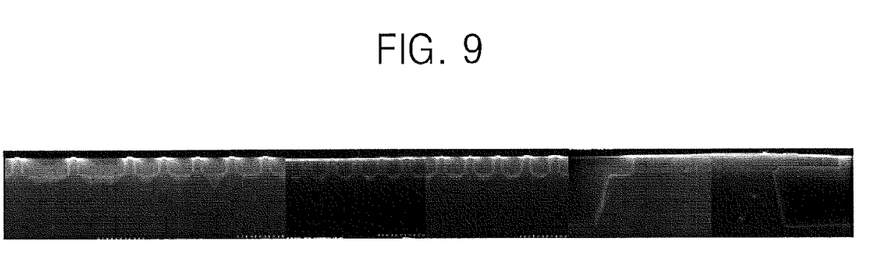
FIG. 9 is a SEM image illustrating a distribution in the height of a gate area, according to some embodiments.
Figure 10:
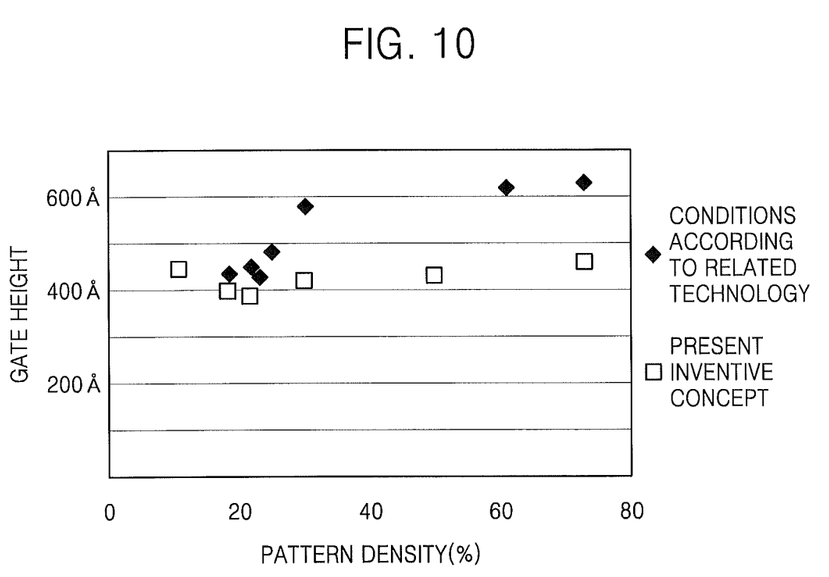
FIG. 10 is a graph illustrating a comparison between a distribution in the height of a gate according to some embodiments herein and a distribution in the height of a gate according to a related art.

FIG. 8 is a SEM image showing a side of a gate area after performing CMP on the capping ILD 52 in operation S240, according some embodiments of FIG. 3. FIG. 9 is a SEM image showing a side of a gate area and showing distribution in the height of a gate area according to a pattern density, according to some embodiments of FIG. 3. FIG. 10 is a graph showing a comparison between distribution in the height of a gate of FIG. 9 and distribution in the height of a gate according to a related art/technology. In FIG. 10, the height of a gate is sectioned along the vertical axis of the graph by a unit/ denomination of 100 Å.

In FIGS. 8-10, a slurry used in the CMP process may have an etching rate selectivity of about oxide:polysilicon=100:1. In a polysilicon stop CMP process, a polishing stop efficiency in polysilicon may be increased/maximized, and thus loss of a dummy gate 20 height may be reduced/minimized, due to polishing primarily (e.g., substantially only) an oxide film rather than polysilicon.

As illustrated in the SEM image of FIG. 9 and the graph of FIG. 10, in an area where the pattern density of the dummy gate 20 ranges from about 10% to about 80%, distribution in the height of gate appears to be about 200 Å, according to a related art/technology. In other words, the variation in the gate height appears to be about 200 Å according to the related art/technology. In contrast, according to some embodiments of FIG. 3, distribution in the height of gate is equal to, or less than, about 100 Å.

As described above, according to some embodiments, after the gate mask 30 is etched at a high selectivity with respect to a dummy gate 20, the ILD 50/52 is polished at a high selectivity with respect to the dummy gate 20 so that loss of a gate height may be reduced/minimized. Moreover, a process of depositing an oxide included in the ILD 50/52 may be performed between (a) a gate mask 30 etching process and (b) an ILD 50/52 polishing process. Thus, a local dent in the spacer 40 due to etching, as well as dishing in an oxide area (e.g., in the ILD 50/52) between dummy gates 20, may be compensated/covered so that a dent in a sidewall of a dummy gate 20 may be reduced/prevented in a subsequent process (e.g., a subsequent dummy gate 20 stripe process).

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of forming a gate in a gate-last process, comprising:
    performing a first chemical mechanical polishing (CMP) on a first interlayer dielectric (ILD) that is on a plurality of dummy gates, each of the plurality of dummy gates comprising a gate mask in an upper portion thereof and spacers on opposing sidewalls thereof, and the first CMP exposing a surface of the gate mask;
    removing the gate mask by etching the gate mask, wherein etching the gate mask comprises partially recessing the spacers to provide partially-recessed top surfaces of the spacers;
    depositing a second ILD on the plurality of dummy gates and on the partially-recessed top surfaces of the spacers after removing the gate mask; and
    performing a second CMP on the second ILD, wherein a top surface of the second ILD is substantially coplanar with top surfaces of the plurality of dummy gates after performing the second CMP, and wherein the second ILD is on the partially-recessed top surfaces of the spacers after performing the second CMP.

2. The method of claim 1, wherein etching the gate mask comprises etching by dry etching or wet etching.

3. The method of claim 1, wherein, in removing the gate mask by etching the gate mask, an etching rate selectivity between the gate mask and the first ILD ranges from about 1:1.5 to about 1:0.5.

4. The method of claim 1, wherein, in removing the gate mask by etching the gate mask, an etching rate selectivity between the gate mask and each of the of plurality of dummy gates ranges from about 2:1 to about 1000:1.

5. The method of claim 1, wherein the first ILD comprises oxide.

6. The method of claim 1, wherein the gate mask comprises silicon nitride ($Si_3N_4$).

7. The method of claim 1, wherein each of the plurality of dummy gates comprises polysilicon (Poly-Si).

8. The method of claim 1, wherein the second ILD is deposited by any one of tetra ethyl ortho silicate (TEOS), high density plasma (HDP), spin-on-glass (SOG), high aspect ratio process (HARP), and flowable chemical vapor deposition (FCVD).

9. The method of claim 1, wherein the second ILD is deposited to a thickness ranging from about 150 Å to about 1000 Å.

10. The method of claim 1, wherein:
    the second CMP on the second ILD is performed at a selectivity of polishing speed between the second ILD and each of the plurality of dummy gates that ranges from about 10:1 to about 200:1; and
    the second CMP provides a polish stop on an upper surface of each of the plurality of dummy gates.

11. The method of claim 1, wherein the second CMP is performed on portions of the first ILD.

12. The method of claim 1, wherein:
the first ILD is between adjacent ones of the spacers;
the second ILD comprises a capping ILD; and
depositing the second ILD comprises covering top surfaces of the spacers and a top surface of the first ILD.

13. The method of claim 1, wherein partially recessing the spacers to provide partially-recessed top surfaces of the spacers comprises partially recessing the spacers to provide respective dents in the top surfaces of the spacers.

14. The method of claim 13, wherein:
depositing the second ILD comprises depositing the second ILD on the dents in the top surfaces of the spacers; and
the second ILD is on the dents in the top surfaces of the spacers after performing the second CMP.

15. A gate area in a gate-last process, comprising:
a plurality of dummy gates arranged on a semiconductor substrate;
spacers on opposing sidewalls of each of the plurality of dummy gates, wherein the spacers comprise partially-recessed top surfaces;
a first interlayer dielectric (ILD) between adjacent ones of the spacers, wherein:
the first ILD comprises oxide;
a gate mask comprises silicon nitride ($Si_3N_4$); and
each of the plurality of dummy gates comprises polysilicon (Poly-Si); and
a second ILD on the plurality of dummy gates and on the first ILD, wherein a top surface of the second ILD is substantially coplanar with top surfaces of the plurality of dummy gates, and wherein the second ILD is on the partially-recessed top surfaces of the spacers.

16. The gate area of claim 15, wherein the second ILD comprises oxide.

17. A gate area in a gate-last process, comprising:
a plurality of dummy gates arranged on a semiconductor substrate;
spacers on opposing sidewalls of each of the plurality of dummy gates, wherein the spacers comprise partially-recessed top surfaces, wherein the partially-recessed top surfaces of the spacers comprise respective dents in the top surfaces of the spacers;
a first interlayer dielectric (ILD) between adjacent ones of the spacers; and
a second ILD on the plurality of dummy gates and on the first ILD, wherein a top surface of the second ILD is substantially coplanar with top surfaces of the plurality of dummy gates, and wherein the second ILD is on the partially-recessed top surfaces of the spacers.

18. The gate area of claim 17, wherein the second ILD is on the dents in the top surfaces of the spacers.

* * * * *